(12) United States Patent
Posseme et al.

(10) Patent No.: US 9,583,339 B2
(45) Date of Patent: Feb. 28, 2017

(54) METHOD FOR FORMING SPACERS FOR A TRANSISTOR GATE

(71) Applicants: COMMISSARIAT A L'ENERGIE ATOMIQUE ET AUX ENERGIES ALTERNATIVES, Paris (FR); CNRS Centre National de la Recherche Scientifique, Paris (FR); APPLIED MATERIALS, Inc., Santa Clara, CA (US)

(72) Inventors: Nicolas Posseme, Grenoble (FR); Thibaut David, Goncelin (FR); Olivier Joubert, Meylan (FR); Thorsten Lill, Santa Clara, CA (US); Srinivas Nemani, Santa Clara, CA (US); Laurent Vallier, Meylan (FR)

(73) Assignees: COMMISSARIAT A L'ENERGIE ATOMIQUE ET AUX ENERGIES ALTERNATIVES, Paris (FR); CNRS-Centre National de la Recherche Scientifique, Paris (FR); APPLIED MATERIALS, Inc., Santa Clara, CA (US)

(*) Notice: Subject to any disclaimer, the term of this patent is extended or adjusted under 35 U.S.C. 154(b) by 0 days.

(21) Appl. No.: 15/091,916

(22) Filed: Apr. 6, 2016

(65) Prior Publication Data

US 2016/0300709 A1 Oct. 13, 2016

Related U.S. Application Data

(63) Continuation of application No. 14/142,248, filed on Dec. 27, 2013, now abandoned.

(30) Foreign Application Priority Data

Dec. 28, 2012 (FR) ...................................... 12 62962

(51) Int. Cl.
*H01L 21/302* (2006.01)
*H01L 21/02* (2006.01)
(Continued)

(52) U.S. Cl.
CPC .... *H01L 21/0234* (2013.01); *H01L 21/02532* (2013.01); *H01L 21/26506* (2013.01); *H01L 21/3065* (2013.01); *H01L 21/30604* (2013.01)

(58) Field of Classification Search
CPC ........... H01L 21/0217; H01L 21/02321; H01L 21/0234; H01L 21/31111; H01L 21/31116;
(Continued)

(56) References Cited

U.S. PATENT DOCUMENTS 4,956,314 A 9/1990 Tam et al.
6,380,030 B1 4/2002 Chen et al.
(Continued)

FOREIGN PATENT DOCUMENTS

| JP | 59-181539 | 10/1984 |
|---|---|---|
| WO | 2004/059725 A1 | 7/2004 |
| WO | 2011/054560 A1 | 5/2011 |

OTHER PUBLICATIONS

French Preliminary Search Report and Written Opinion issued Jun. 4, 2013, in Patent Application No. FR 1262962, filed Dec. 28, 2012 (With English Translation of Category of Cited Documents).
(Continued)

*Primary Examiner* — Nadine Norton
*Assistant Examiner* — Christopher Remavege
(74) *Attorney, Agent, or Firm* — Oblon, McClelland, Maier & Neustadt, L.L.P.

(57) ABSTRACT

A method is provided for forming spacers for a gate of a field effect transistor, the gate being situated above a layer of semiconductor material, including forming a layer of nitride
(Continued)

covering the gate; modifying the layer by plasma implantation of light ions, having an atomic number equal or less than 10, in the layer in order to form a modified layer of nitride, the modifying being performed so as not to modify the layer of nitride over its entire thickness at flanks of the gate; and removing the modified layer of nitride by a selective wet or dry etching, of the modified layer relative to said layer of semiconductor material and relative to the non-modified layer at the flanks of the gate, without etching the layer of semiconductor material, wherein an entire length of the non-modified layer at the flanks remains after the selective wet or dry etching.

28 Claims, 12 Drawing Sheets

(51) Int. Cl.
  *H01L 21/306*    (2006.01)
  *H01L 21/265*    (2006.01)
  *H01L 21/3065*    (2006.01)

(58) Field of Classification Search
  CPC ......... H01L 21/31155; H01L 29/66628; H01L 29/66772
  USPC .. 216/37, 58, 62, 63, 67, 72, 73, 74, 79, 83, 216/92, 96, 99, 103, 104; 257/E21.209, 257/E21.251, E21.422, E29.129, 257/E21.215, E21.248, E21.252, 257/E21.453, E21.64, 314, 317; 438/689, 438/201, 256, 257, 258, 289, 301, 586, 438/705, 696

See application file for complete search history.

(56) References Cited

U.S. PATENT DOCUMENTS

| | | |
|---|---|---|
| 7,977,249 B1 | 7/2011 | Liu et al. |
| 2002/0110972 A1 | 8/2002 | Chen et al. |
| 2004/0087155 A1 | 5/2004 | Wieczorek et al. |
| 2011/0111592 A1 | 5/2011 | Cheng et al. |
| 2011/0300711 A1 | 12/2011 | Martin et al. |
| 2014/0057404 A1 | 2/2014 | Qin et al. |
| 2014/0273292 A1 | 9/2014 | Posseme |

OTHER PUBLICATIONS

European Search Report issued Jan. 24, 2014, in Patent Application No. EP 13 19 9218 (with English Translation of Category of Cited Documents).

Edited by Andre Anders, "Handbook of Plasma Immersion Ion Implantation and Deposition", (John Wiley & Sons, Inc.), A Wiley-Interscience Publication, XP055098427, Oct. 3, 2000, pp. 637-681, URL:www6.cityu.edu.hk/appkchu/Publications/2000/00.12.pdf.

PRIOR ART

Prior art

Prior art

Prior art

METHOD FOR FORMING SPACERS FOR A TRANSISTOR GATE

CROSS-REFERENCE TO RELATED APPLICATIONS

This application is a continuation of U.S. application Ser. No. 14/142,248, filed Dec. 27, 2013, which claims the benefit of priority from prior French Application No. 12 62962, filed Dec. 28, 2012. The entire contents of each of which are incorporated herein by reference.

TECHNICAL FIELD OF THE INVENTION

The present invention concerns in general field effect transistors (FET) used by the microelectronics industry and more particularly the realization of gate spacers of transistors of the metal-oxide-semiconductor (MOSFET) type mainly used for the production of all kinds of integrated circuit.

PRIOR ART

The incessant race for the reduction in size that characterizes the whole microelectronics industry could not have taken place except with the contribution of key innovations throughout the decades of development since the first integrated circuits were produced industrially in the nineteen sixties. A very important innovation that goes back to the nineteen seventies, and which is still used, consists of realizing MOSFET transistors by means of a technique in which the source and drain electrodes are auto-aligned on those of the gate and therefore do not require a photoetching operation for definition thereof. Combined with the use of gates made from polycrystalline silicon, it is the gates themselves, produced first, that serve as a mask during the doping of the source and drain regions of the transistors.

FIG. 1a is a given section of an example of this type of transistor 100 during realization. The source and drain regions 110 can be seen therein, overall designated as source/drain regions, since they are very generally perfectly symmetrical and can fulfil the two roles according to the electrical biasings that are applied to the transistor. The gate conventionally consists of a stacking of layers 120, a major part of which always consists of polycrystalline silicon 123. The formation of the source and drain regions is typically done by ion implantation 105 of dopants in the regions 110, the gate 120 serving as a mask as mentioned above, thus preventing the doping of the region of the MOSFET transistor in which, according to the voltages applied to the gate, the conduction channel 130 between source and drain will be able to develop.

The basic technique, very briefly described above, well known to persons skilled in the art along with numerous variants, has been constantly perfected for the purpose of improving the electrical performances of the transistors while making it possible to accommodate the successive reductions in size of the transistors necessitated by an ever increasing integration of a large number of components in an integrated circuit.

One technique widely used currently consists of manufacturing the integrated circuits starting from elaborate substrates 140 of the silicon on insulator type designated by their acronym SOI. The elaborate SOI substrate is characterized by the presence of a fine surface layer of monocrystalline silicon 146 resting on a continuous layer of silicon oxide 144, referred to as buried oxide or BOX, the acronym for buried oxide layer. The strength and mechanical rigidity of the assembly are provided by the layer 142, which constitutes the body of the SOI substrate often referred by the term "bulk" to indicate that the starting substrate is very generally made from solid silicon. This structure offers numerous advantages for the realization of MOSFET transistors. In particular, it allows a drastic reduction in the stray capacitances because of the presence of the insulating continuous layer 144. With regard to the invention, it will be stated only that the surface layer of monocrystalline silicon 146 can be controlled precisely for thickness and doping. In particular it is advantageous for the performances of the transistors that the channel 130 can be completely depleted of carriers, that is to say "fully depleted" (FD), the term that is generally used to designate this state. This is obtained by realizing the transistors from SOI substrates wherein the superficial layer 146 is very thin, which is not without any inconvenience moreover as will be seen in the description of the invention. This type of transistor is thus designated by the acronym FDSOI.

One improved to the basic auto-alignment technique that has been universally adopted consists in the formation of spacers 150 on the flanks of the gates. The spacers 150, typically made from silicon nitride (SiN), will in particular enable the use of a so-called "raised source and drain" technique. In order to be able to maintain low electrical resistances for access to the source and drain electrodes, despite the reduction in size of the transistors, it has been necessary in fact to increase the cross section thereof. This is obtained by selective epitaxy of the source/drain regions 110. During this operation the initial layer of monocrystalline silicon 146 will be grown 112 locally. It is then necessary to protect the gate regions in order to prevent the growth from also taking place from the polycrystalline silicon 123 of the gate. It is among other things the role of the spacers to fulfil this function. They also fulfil a role of preservation of the gate during the silicidation of the contacts (not shown), which is then performed for the same purpose in order to reduce the serial resistance of access to the electrodes of the transistor.

The formation of the spacers 150 has become a crucial step in the formation of transistors, which now achieved dimensions that are measured normally in nanometers ($nm=10^{-9}$ meters) and which are overall of decananometric sizes. The realization of the spacers is done without involving any photoetching operation. They are auto-aligned on the gate 120 by means of the deposition of a uniform layer of silicon nitride (SIN) 152, which then undergoes a very highly anisotropic etching. This etching of the SIN preferentially attacks the horizontal surfaces, that is to say all the surfaces that are parallel to the plane of the SOI substrate. It leaves in place, imperfectly, only the vertical parts of the layer 152, those substantially perpendicular to the plane of the substrate, in order to obtain in practice the patterns 150 the ideal shape of which will obviously be rectangular.

With the known solutions, the reduction is size of the transistors makes it very tricky to obtain spacers completely fulfilling their role of isolation and not causing any defects in the realization of the transistors from SOI substrates. This is because, in the context of the present invention, and as will be detailed hereinafter, it has been found that several types of defect appear in the use of the known solutions.

The object of the present invention is to propose a method for forming spacers completely fulfilling their role of isolation and which would eliminate or limit the defects in the realization of transistors.

The other objects, features and advantages of the present of the invention will emerge from an examination of the following description and accompanying drawings. Naturally other advantages can be incorporated.

SUMMARY OF THE INVENTION

To achieve this objective, one aspect of the present invention concerns a method for forming spacers of a gate of a field effect transistor, the gate being situated above a layer made from semiconductor material preferably intended to form a conduction channel for the transistor. The method comprises a step forming a layer of nitride covering the gate of the transistor, the layer of silicon nitride covering at least a top and the flanks of the gate. The method comprises the following steps:

- after the step of forming the layer of nitride, at least one step of modifying the layer of nitride by implanting light ions in the layer of nitride in order to form a modified layer of nitride, a step of modification being performed so as not to modify the layer of nitride over the whole of its thickness at the flanks of the gate;
- at least one step of removing the modified layer of nitride by means of selective etching of the modified layer of nitride vis-à-vis said semiconductor material and vis-à-vis the non-modified layer of nitride.

Particularly advantageously, the modification of the layer of nitride by implantation of light ions, typically hydrogen ($H_2$) or helium (He), considerably improves the selectivity of this layer compared with the semiconductor material, typically silicon. This implantation also means that the thickness of modified nitride is etched more rapidly than the non-modified nitride.

The etching thus consumes the modified layer of nitride preferentially to the layer of semiconductor material and the non-modified layer of nitride. Thus the risk of excessive consumption of the superficial layer of semiconductor material is reduced or even eliminated.

Preferably, the modification of the layer of nitride keeps a thickness of non-modified nitride on the flanks of the gate. This thickness is preserved, at least partly, during the selective etching. It then defines gate spacers.

The invention thus makes it possible to obtain nitride spacers while reducing or even eliminating the problems of the known solutions mentioned previously.

According to an embodiment, the implantation of species is performed using a plasma.

This type of implantation offers the advantage of enabling a continuous implantation in a volume extending from the surface of the implanted layer.

Furthermore the use of plasma allows implanting ions at lower depths than the minimum depth that is achievable with implanters. Thus, a plasma implantation enables to implement efficiently and relatively homogenously or at least in a continuous manner a thin layer that may then be removed by selective etching. This continuous implantation extending from the outer face of the implanted layer improves the uniformity of the modification along the depth, which leads to a more constant etching rate of the implanted layer. Moreover, the selectivity enhancement brought by the modification of the implanted layer is available from the very beginning of the etching of the implanted layer. The plasma implantation thus allows significantly improving the etching precision.

Implantation with a plasma allows implanting species and then removing a thickness extending from the surface of the implanted layer and to a depth ranging from 0 nm to 100 nm.

Conventional implanters allow implantation in a volume extending from 30 nm under the surface of the implanted layer and several hundred nanometers. Thus conventional implanters do not allow implanting species between the surface of the implanted layer and a depth of 30 nm. During the development of the present invention, it was noticed that implanters cannot obtain a constant etching rate of the modified layer and from the surface thereof, thus resulting in reduced precision of etching compared to the invention.

The use of plasma to modify the layer to be removed is therefore particularly advantageous in the context of the invention which is to remove a thin layer of nitride, typically between 1 and 10 nm and more usually between 1 and 30 nm, said thin layer extending from the surface of the implanted layer.

According to an embodiment, the step of modification performed with a plasma modifies the nitride layer continuously from the surface of the nitride layer and to a thickness between 1 nm and 30 nm and preferably between 1 nm and 10 nm.

According to an embodiment, the modification and the removal of the nitride layer are performed in a single plasma reactor, which significantly simplifies the process and saves time and cost.

The invention proves particularly advantageous for forming spacers of FDSOI or FinFET transistors for example.

Also advantageously, the modification of the layer of nitride by implantation of light ions such as hydrogen ($H_2$) or helium (He) also improves the selectivity of this layer of nitride modified with respect to the oxide of the semiconductor material. Typically, in the case of a FinFET transistor, the modified layer of nitride is removed from the fins whereas the gate oxide is not consumed or is less consumed.

Optionally, the method may also have at least any one of the following features and steps:

Preferably, the parameters of the implantation, in particular the energy of implantation of the light ions and the implanted dose, are provided so that the modified layer of nitride can be etched selectively vis-à-vis said semiconductor material and vis-à-vis the non-modified layer of nitride.

According to one embodiment, the layer of nitride is a layer of silicon nitride.

According to one embodiment, the step of modifying the layer of silicon nitride is preceded by a principal step of anisotropic etching. Preferably, the principal step of anisotropic etching consists in a dry etching in a plasma based on methyl fluoride ($CH_3F$).

According to one embodiment, the step of modification comprises putting the layer of silicon nitride together with a plasma comprising the light ions in an etching reactor.

According to another embodiment, the step of modification by implantation of light ions is performed by means of an implanter.

"Light ions" means ions coming from materials the atomic number of which in the periodic classification of elements is low. In general terms all the elements that can be implanted in the material to be etched, without causing dislocation of its atomic structure such that it would give rise to sputtering of the latter, and therefore without redeposition of the etched material on the walls of the reactor or the patterns in the course of etching themselves, are able to suit.

Preferably, the light ions are taken among hydrogen ($H_2$) and helium (He), the atomic numbers of which are 1 and 2, respectively. More generally, in the context of the present invention, the "light ions" are taken among all the species having an atomic number equal or less than 10.

According to one embodiment, the step of removing the modified layer of silicon nitride is effected by wet etching selective to said semiconductor material. Preferably, the semiconductor material is silicon and the step of removing the modified layer of silicon nitride is effected by wet etching selectively to silicon (Si) and/or silicon dioxide ($SiO_2$). More generally, the semiconductor material is taken among the silicon (Si), the germanium (Ge) or the silicon-germanium (SiGe) and the step of removing the modified layer of nitride is performed by selective wet etching selectively to the semiconductor material and/or an oxide of the semiconductor material.

Preferably, the etching selective to silicon is obtained by means of a solution based on hydrofluoric acid (HF) or using a solution based on phosphoric acid ($H_3PO_4$).

According to another embodiment, the step of removal is performed by dry etching selective to said semiconductor material. Preferably, the step of removing the modified layer of silicon nitride is effected by dry etching selective to silicon (Si) and/or to silicon dioxide ($SiO_2$). According to one embodiment, the dry etching is performed in a plasma formed in a confined chamber using nitrogen trifluoride ($NF_3$) and ammonia ($NH_3$). This embodiment allows significantly enhancing the selectivity of the etching of the modified nitride with regard to the etching of the non-modified nitride or the semiconductor material. Typically, this selectivity is increased by a factor 10 compared to conventional etchings based on HF.

Advantageously, the dry etching comprises: a step of etching consisting of the formation of solid salts; a step of sublimation of the solid species.

Advantageously, the implantation is performed so as to modify the entire thickness of the layer of nitride apart from the layer of nitride disposed on the flanks of the gate. Thus the etching removes the entire layer of nitride with the exception of at least part of the layer of nitride situated on the flanks of the gate.

Advantageously, the thickness of the modified layer of nitride on the flanks of the gate is zero or is less than the thickness of the layer of nitride before modification by implantation.

Advantageously, the implantation modifies the layer of nitride from its surface and to a depth corresponding to at least part of its thickness. Preferably, the implantation modifies the layer of nitride in an interrupted manner from the surface.

According to a particular embodiment, the method comprises a single step of modification performed so as to modify the layer of silicon nitride throughout its thickness over all the surfaces parallel to the plane of a substrate on which the gate rests and not to modify the layer of silicon nitride throughout its thickness on the surfaces perpendicular to this plane. These surfaces perpendicular to this plane, that is to say perpendicular to the layer made from a semiconductor material forming a conduction channel or to the solid substrate, are typically parallel to the flanks of the gate of the transistor. Thus, following this single step of modification, a selective etching of the modified layer of silicon nitride removes the layer of silicon nitride over all the surfaces except on those parallel to the flanks of the gate.

According to another embodiment, the method comprises several sequences each comprising a step of modification and a step of removal. During at least one of the steps of modification, only part of the thickness of the layer of silicon nitride is modified. Advantageously, the sequences are repeated until the layer of silicon nitride disappears on all the surfaces parallel to the plane of a substrate on which the gate rests. Only the faces parallel to the flanks of the gate keep a thickness of silicon nitride, this thickness not having been the subject of modification by implantation.

According to an advantageous embodiment, the layer of nitride is disposed directly in contact with the layer made from a semiconductor material. Preferably, the layer of nitride is disposed directly in contact with the gate, which is preferably formed in a semiconductor material.

Advantageously, the gate of the transistor is situated on a stacking of layers forming an elaborate substrate of the silicon on insulator (SOI) type. Preferably, it is disposed directly in contact with the layer forming the conduction channel. Advantageously, the use of the invention with such an SOI substrate makes it possible to preserve the integrity of the superficial layer of very slight thickness that forms the conduction channel of a transistor formed from an SOI substrate.

Advantageously, the semiconductor material is silicon.

Advantageously, the etching is selective to silicon dioxide ($SiO_2$).

Alternatively, the semiconductor material is taken from: germanium (Ge) or silicon germanium (SiGe).

According to one embodiment, the transistor is a transistor of the FDSOI type. Preferably, the method comprises a step of complete removal of the layer of nitride apart from the flanks and on either side of the gate in order to bare the layer made from a semiconductor material and a step of formation of source drain regions from the layer made from a semiconductor material, for example by epitaxy.

According to another embodiment, the transistor is a transistor of the FinFET type.

According to one embodiment, the implantation of ions is performed by at least two and preferably three implantations having different implantation directions and in which, in order to modify the direction of the implantation, the layer of nitride is inclined. The invention makes it possible to remove the layer of nitride at least in part over all the surfaces of a pattern. Typically, this pattern is a fin of a FinFET transistor.

Preferably, the implantation of ions comprises a first anisotropic implantation performed in a direction substantially perpendicular to a layer on which the pattern is situated, a second implantation performed in a direction not parallel to first flanks of the pattern and so as to implant light ions in the first flanks, a third implantation performed in a direction not parallel to second flanks of the pattern and so as to implant light ions in the second flanks. The steps of implantation and removal are performed so as to remove, during the removal step, the layer of nitride situated outside the flanks and at least part of the layer of nitride covering the first and second flanks. According to a first embodiment, an implantation is performed so as to modify the layer of nitride covering said flanks over a depth corresponding to only a portion of the thickness of the layer of nitride covering said flanks. The thickness of the layer that is kept on the pattern can then be adjusted precisely. According to a first embodiment, an implantation is performed so as to modify the layer of nitride covering said flanks over a depth corresponding to the entire thickness of the layer of nitride covering said flanks. All the layer of nitride covering the pattern can then be removed. It is this embodiment that is applied in order to remove the layer of nitride on the fins of a FinFET transistor.

Another aspect of the present invention concerns a method for etching a layer of silicon nitride selectively for silicon (Si) and/or silicon dioxide ($SiO_2$), comprising:

at least one step of modifying all or part of the layer of silicon nitride by implantation of light ions such as hydrogen ($H_2$) and helium (He) in the layer of silicon nitride in order to form a modified layer of silicon nitride;

at least one step of removing the modified layer of silicon nitride by means of a selective etching of the modified layer of silicon nitride vis-à-vis silicon (Si) and/or silicon dioxide ($SiO_2$).

Advantageously, the implantation, in particular its energy, the concentration and the nature of the light ions, the dose used and the duration of the implantation method, are designed so that the modified layer of nitride can be etched selectively vis-à-vis the rest of the layer of nitride, that is to say the non-modified layer of nitride.

Advantageously, the modification of the layer of silicon nitride by implantation of hydrogen ($H_2$) or helium (He) improves the selectivity of this layer compared to silicon and/or silicon dioxide.

Preferably, the etching is obtained by means of a solution based on phosphoric acid ($H_3PO_4$) or by means of a solution based on hydrofluoric acid (FH).

BRIEF DESCRIPTION OF THE FIGURES

The aims and objects as well as the features and advantages of the invention emerge more clearly from the detailed description of an embodiment thereof that is illustrated by the following accompanying drawings, wherein.

The accompanying drawings are given by way of examples and are not limitative of the invention. These drawings are schematic representations and are not necessarily to the scale of practical application. In particular, the relative thicknesses of the layers and substrates are not representative of reality.

DETAILED DESCRIPTION OF THE INVENTION

In the context of the present invention, the term "on", "surmounts" or "underlying" or the equivalents thereof do not necessarily mean "in contact with". Thus, for example, the deposition of a first layer on a second layer does not necessarily mean that the two layers are directly in contact with each other but means that the first layer at least partially covers the second layer while being either directly in contact therewith or being separated therefrom by another layer or another element.

In the following description, the thicknesses are generally measured in directions perpendicular to the plane of the bottom face of the layer to be etched or of a substrate on which the bottom layer is disposed. Thus the thicknesses are generally taken in a vertical direction on the figures depicted. On the other hand, the thickness of a layer covering a flank of a pattern is taken in a direction perpendicular to this flank.

In the context of the present invention, several types of defect have been observed during the etching of the spacers using one or other of the standard anisotropic etching methods developed by the microelectronics industry.

Figure 1A:
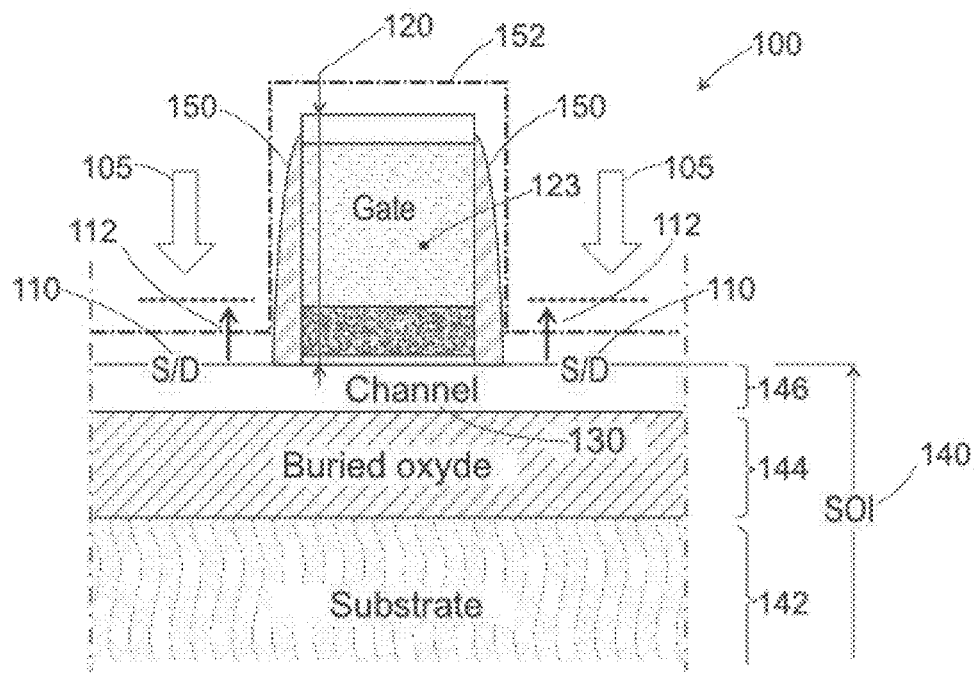
FIGS. 1a to 1d show, first, a view in section of an example of a MOSFET transistor of the FDSOI type during realization and, secondly, illustrates various defects that can be observed on structures of FDSOI transistors during the etching of the spacers using one or other of the standard anisotropic etching methods developed by the microelectronics industry.
Figure 1B:
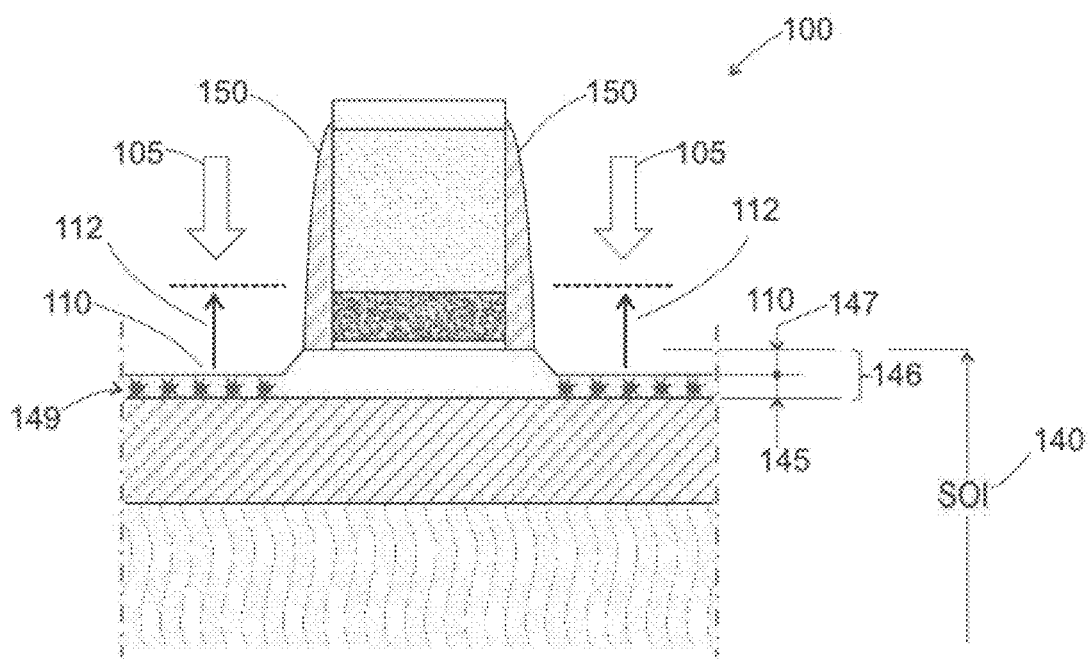
Figure 1C:
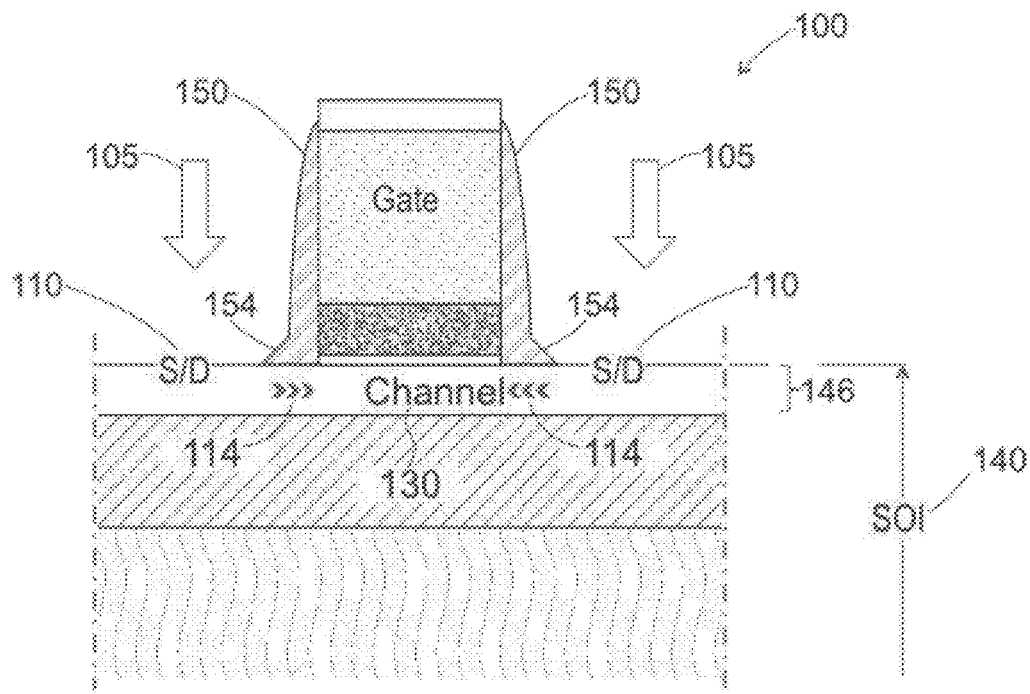
Figure 1D:
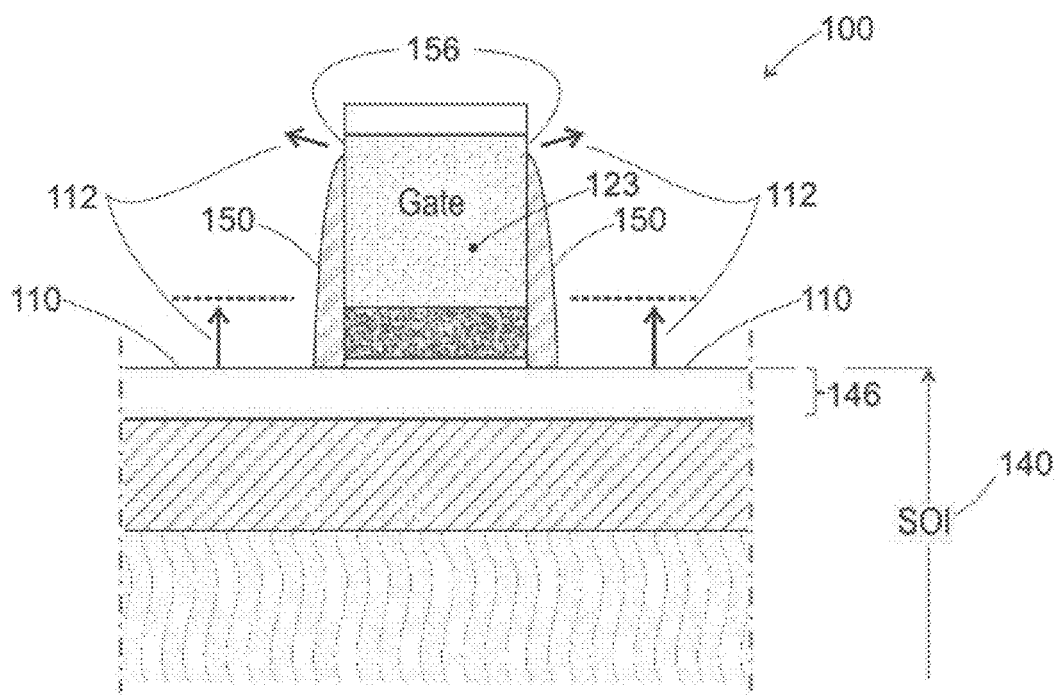

FIGS. 1b, 1c and 1d each illustrate a type of defect observed.

A type of etching is in particular used that is said to be "dry" and is implemented by means of a method that is usually designated by its acronym RIE, from "reactive-ion etching". This is an etching method in which a plasma is formed, in a confined enclosure, that reacts physically and chemically with the surface of the slice to be etched. In the case of the etching of a layer of silicon nitride, which is, as seen the preferred material for realizing spacers, the reactive gas is typically methyl fluoride ($CH_3F$), which is caused to react with the material to be etched while also introducing dioxygen ($O_2$) and possibly helium (He). In this way an etching plasma is formed based on fluorine chemistry and often designated by its constituents: $CH_3F/O_2$/He. In this plasma the fluorine compound serves to etch the silicon nitride while the oxygen limits the polymerisation of the methyl fluoride and also serves to oxidise the silicon when this material is reached during etching. The layer of oxide formed on the silicon retards the etching of the silicon at the cost however of a surface transformation of the latter into oxide and therefore a surface consumption of silicon. The helium serves as a diluent for the oxygen. Other reactive gases have been experimented with such as methane ($CH_4$) and sulphur hexafluoride ($SF_6$).

The advantage of this type of etching is that it is fairly anisotropic and sufficiently controls the profile of the spacers 150 even if it is not possible in practice to obtain the ideal rectangular form. The drawback of this type of etching is that the selectivity of attack of this underlying silicon is however limited. The selectivity, that is to say the ratio of the etching speeds between silicon nitride and silicon is around 10 and may at a maximum reach 15 according to the conditions of formation of the plasma (the nitride is etched 10 to 15 times more quickly than the silicon).

So-called "wet" etchings based on hydrofluoric acid (HF) or phosphoric acid ($H_3PO_4$) are also used, which have a much better selectivity, respectively, vis-à-vis silicon or its oxide ($SiO_2$) but which do not however make it possible to control the profile of the spacers since the etching is essentially isotropic in this case. It should be noted here that this type of etching is also referred to as "wet clean".

It should be noted here that there exist many publications on the subject of the etching silicon nitride and/or gate spacers in general. Reference can be made for example to the following American patents or patent applications: 2003/0207585; U.S. Pat. Nos. 4,529,476; 5,786,276 and 7,288,482.

FIG. 1b illustrates a first problem that relates to the insufficient selectivity in attack that exists during dry etching of the CH₃F/O₂/He type between the silicon nitride and the silicon of the superficial layer 146. The result is that a result significant fraction of the thin superficial layer of monocrystalline silicon 146 of the SOI substrate can then be partially consumed 147 during the anisotropic etching of the nitride. As seen in the section on the prior art, the superficial layer 146 is chosen so as to have a low thickness in order to improve the electrical characteristics of the transistors. It is typically less than 10 nm. The remaining thickness 145 may be very small. Under these conditions the ion implantation 105 for forming the source and drain regions 110 that will follow is liable to be very detrimental to the remaining monocrystalline silicon. The implantation energy of the dopants may be sufficient to cause complete amorphisation 149 of the mono-crystallized silicon, which will then in particular compromise the following step of epitaxial growth 112 intended to form the raised source/drain. As seen in the section on the prior art, the latter operation is made necessary because of the reduction in size of the transistors in order to be able to maintain the resistances of access to the source and drain electrodes at sufficiently low values in order not to impact on the electrical functioning of the transistors. A growth from a layer of silicon partially or totally made amorphous will create many defects in the layer formed by epitaxy.

FIG. 1c illustrates another problem where there is not any significant consumption of the silicon of the superficial layer 146 but there is a formation of "feet" 154 at the bottom of the patterns of silicon nitride remaining on the flanks of the gate after etching. The consequence is that the transition 114 of the junctions that are formed after doping by ion implantation 105 of the source and drain regions 110, with the region of the channel 130, is much less abrupt than when the spacers do not have feet, as shown in the previous figures. The presence of feet 154 affects the electrical characteristics of the transistors. It should be noted here that the formation or not of feet at the bottom of the spacers and the consumption or not of silicon of the superficial layer of silicon 146 of the SOI substrate, described in the previous figure, are parameters of adjustment that are opposed to the etching, which require that a compromise can be found for which, ideally, feet are not formed and the superficial layer of silicon is not significantly attacked.

FIG. 1d illustrates a third problem that occurs when the etching produces an excessive erosion of the spacers in the high parts of the gates and bares the polycrystalline silicon 123 in these regions 156. The consequence is that the subsequent epitaxial growth 112 for forming the raised source/drain will also occur at these points, as well as a siliciding of parasitic contacts, which risks causing short-circuits between electrodes. This is because the etching of the spacers requires that the etching time be adjusted in order to etch, for example, 150% of the thickness of nitride deposited. That is to say an overetching of 50% is effected in this example in order to take account of the non-uniformity of the deposition, or of the etching operation itself, at a slice. Thus, in some parts of the slice, it can be seen that there is an excessively pronounced overetching that bares the gate regions 156. This type of defect is also termed "faceting".

FIGS. 2a to 2i illustrate how the problems related to plasma etching are posed more specifically when MOSFET transistors of the FinFET type are realized, another transistor structure that is beginning to be used by the microelectronics industry for technological nodes as from 22 nm. In the FinFET structure the conduction channel consists in a thin vertical blade of silicon, referred to as a "fin". It is surrounded on three sides by the control gate. This makes it possible in particular to obtain transistors having better electrical performances and also to reduce leakage currents.

Figure 2A:
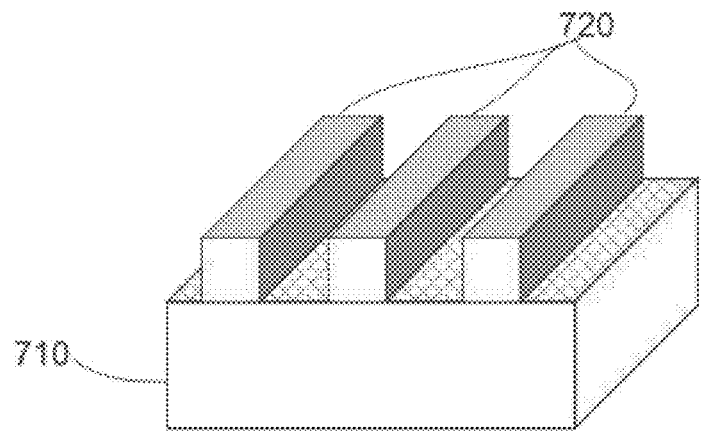
FIGS. 2a to 2i illustrate the three-dimensional (3D) structure of an example of a MOSFET transistor of the FinFET type and the problems of etching that are posed in this case.
Figure 2B:
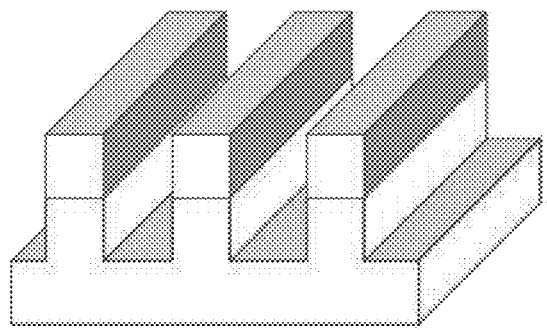
Figure 2C:
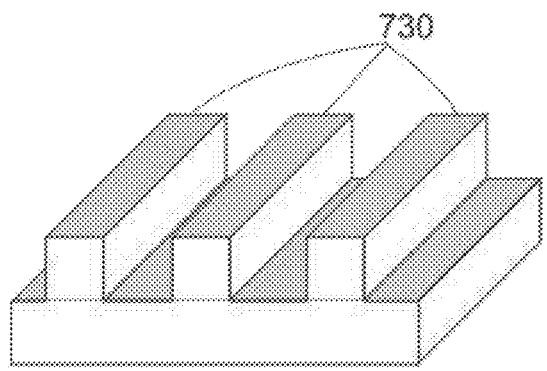

FIGS. 2a to 2i describe the main steps of formation of a FinFET transistor and the difficulties encountered. FIGS. 2a, 2b and 2c illustrate more particularly the formation by etching of a layer 710 of a crystalline semiconductor, usually silicon, three-dimensional patterns, that is to say the "fins", that will form the conduction channel 730 of the transistors. The form of the channels is defined by a hard mask 720 that is transferred by etching into the layer 710. This layer is for example the superficial layer of monocrystalline silicon of an SOI substrate already described and therefore rests on a continuous layer of oxide and a substrate (not shown).

Figure 2D:
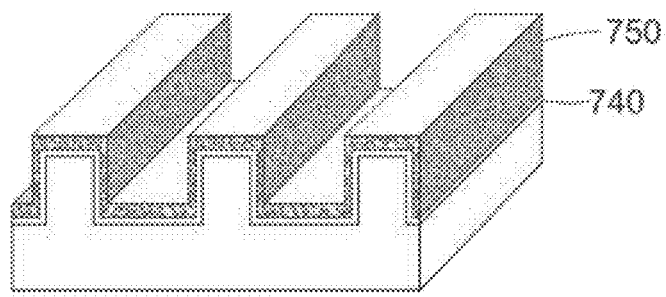
Figure 2E:
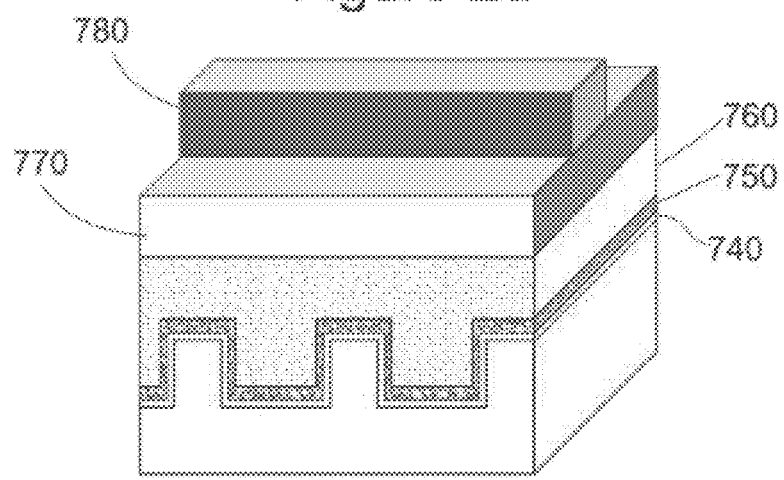
Figure 2F:
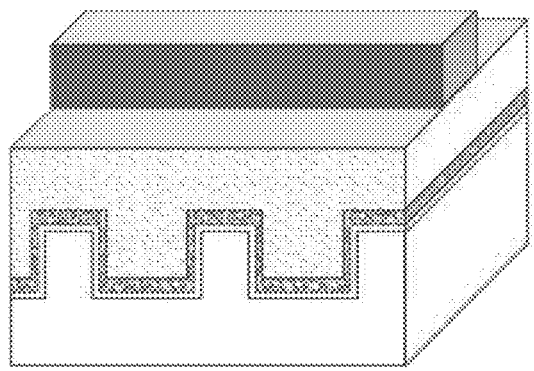

FIGS. 2d, 2e and 2f illustrate the formation of the gate of the transistors. As with the FDSOI transistors the gate consists of a stacking of layers that are successively deposited on the patterns 730 that will constitute the channels. There is therefore the fine insulating layer of gate oxide 740 and the layer 750 made from a high-permittivity (high-k) insulating material covered by a metal gate. The whole is covered by a layer of polycrystalline silicon 760 that has been planed and on which the hard masks 770 and 780, which will make it possible, by etching of the above stacking of layers, to form the gate and the source and drain electrodes of the transistors, are deposited and defined by photolithography.

Figure 2G:
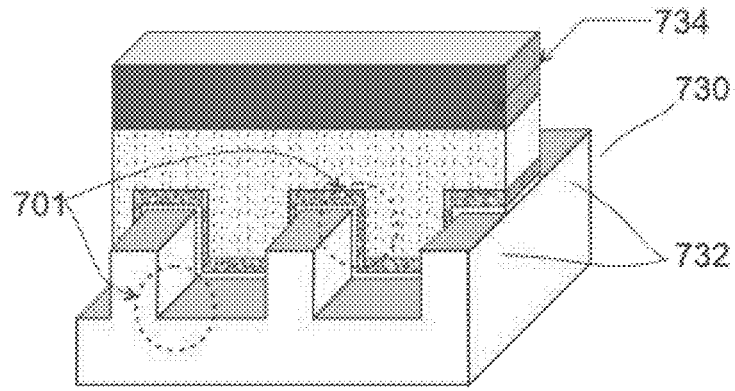
Figure 2H:
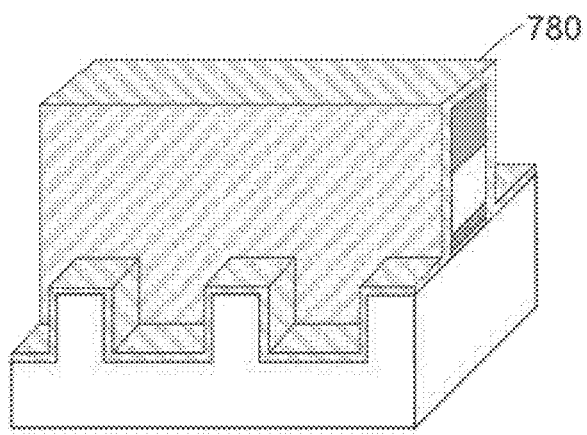
Figure 2I:
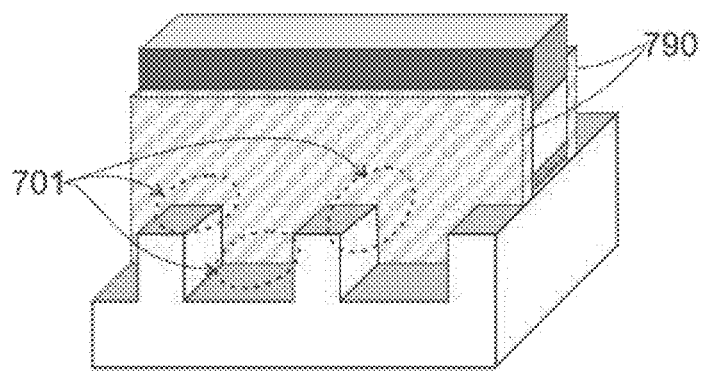

FIGS. 2g, 2h and 2i illustrate the following operations where the etching of the gate layers is carried out, which makes it possible to release, from each pattern 730, the source and drain regions 732 on either side of the gate and to define the length of the channels 734. As with the FDSOI transistors, there is also a need for spacers. They are obtained, after deposition of a continuous layer generally made from silicon nitride, by means of a very anisotropic etching of this layer that leaves in place only the vertical patterns 790 on the flanks of the gate.

Like FTSOI transistors, FinFET transistors therefore suffer, for realization thereof, from the limitations and imperfections of plasma etching. In particular, in order to realize this transistor structure, the etching used must have excellent selectivity vis-à-vis silicon (Si) and its oxide ($SiO_2$), which is difficult to obtain, as seen, with plasma etching. As indicated in FIGS. 2g and 2i, the integrity of the angles of the etched patterns is affected thereby. This is because, for the FinFET transistor to have good performances, the edges 701 of the fins must form angles that are as straight as possible, any rounding of these angles giving rise to a reduction in the performances of the transistor. The same applies to the angle formed by the spacers and the layer on which it rests, typically the layer of silicon. This angle is indicated in a broken line in FIG. 7i.

For the reasons indicated above, the current solutions are based on plasma etchings not making it possible to obtain edges forming right angles.

It is therefore seen that plasma etching, though it has made it possible to follow the reductions in size of the patterns at each introduction of a new technological node in the past years, does however more and more pose problems when the size decreases, in particular beyond the technological node of 22 nm. The use of plasma etching for these dimensions introduces an additional degree of complexity for attempting to overcome the problems described above. Etching chemistries more complex than the traditional one, referred to as fluorocarbon chemistry, have been tested, which require introducing additional gases into the etching chamber. Up to five different gases have been combined in order to form the etching plasma. The prime consequence of this is to make the method considerably more complex.

The three-dimensional (3D) character of the FinFET structure means that the problems disclosed previously for realizing transistors of the FDSOI type are posed with even more acuity for the realization of the FinFETs. It should be noted moreover that the realization of this structure requires having recourse not only to anisotropic etching for realizing spacers 790 on the flanks of the gate electrodes but that it is also possible to etch the flanks of the source/drain electrodes 732 while having recourse to isotropic etching.

As seen, one object of the invention is to dispense with all or at least some of these problems.

To this end, FIGS. 3a to 3d describe the steps of a detailed example of a method according to the invention applied to the realization of FDSOI transistors. The principles of these steps can also be applied to the formation of spacers on the flanks of a gate of a FinFET transistor. FIGS. 7a to 7h, which will be explained subsequently, illustrate steps that will advantageously be implemented for realizing FinFet transistors.

Figure 3A:
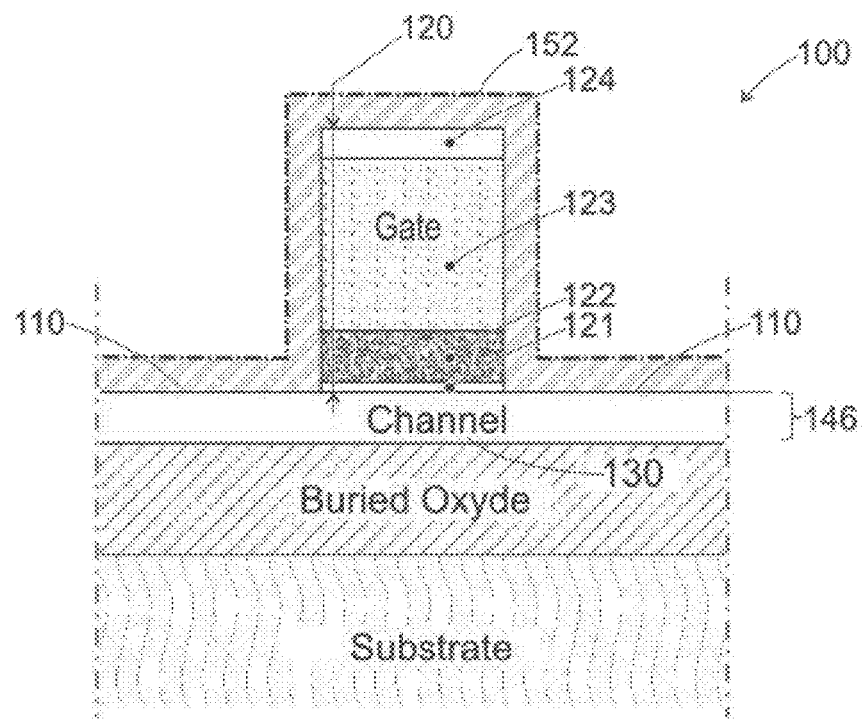
FIGS. 3a to 3d illustrate the steps of an example of a method according to the invention applied to the realization of transistors of the FDSOI type.

FIG. 3a illustrates the step of depositing a layer of silicon nitride 152, with a preferentially substantially uniform thickness, over all the surfaces, vertical and horizontal, of the devices in the course of manufacture. This step, which is not different from the corresponding step of the standard methods and which has already been mentioned in FIG. 1a, is preferably performed by means of a so-called LPCVD deposition method, the acronym for "low pressure chemical vapour deposition". This type of deposition, which is performed below atmospheric pressure, allows in fact a uniform deposition on all the surfaces whatever their orientation.

Although this is not necessary to an understanding of the method of the invention, it should be noted that the gate electrode is in this example composed at this stage of the method of several layers already mentioned in particular in FIG. 2 for FinFET transistors. Apart from the layer of polycrystalline silicon 123, there are found, in the stacking of layers forming the gate 120, first of all the thin insulating layer of gate oxide 121 through which an electrical field will be able to develop in order to create the underlying conduction channel 130 between source and drain when a sufficient electrical voltage is applied to the gate. In the most recent MOSFET transistors a technology referred to as "high-k/metal gate" technology is used, that is to say the dielectric layer 121 is made from an insulating material with high permittivity (high-k) covered by a metal gate represented by the layer 122. This technology was developed in particular to reduce the leakage currents through the gate, which became much too great because of the reduction in the thickness of the dielectric layer 121 to atomic dimensions. At this stage, the stacking of layers of the gate also comprises a hard protective mask 124 that will be removed subsequently to allow resumption of contact on this electrode. This hard mask, which remains in place after etching of the gate, is typically made from silicon dioxide ($SiO_2$). Its role is to protect the top of the gate from any damage during the etching of the spacers.

Preferably, the dielectric layer 121 is disposed in contact with the layer 146 forming the conduction channel. Preferably, the layer 122 is disposed in contact with the layer 121. Preferably, the layer 123 is disposed directly in contact with the gate oxide formed by the layer 121 if the layer 122 is absent or is disposed directly in contact with the layer 122. Preferably, the layer 152 of silicon nitride is disposed directly in contact with the layer 123 at the flanks of the gate. Preferably, the layer 152 of silicon nitride is disposed directly in contact with the layer 146 made from semiconductor material intended to form the conduction channel.

Figure 3B:
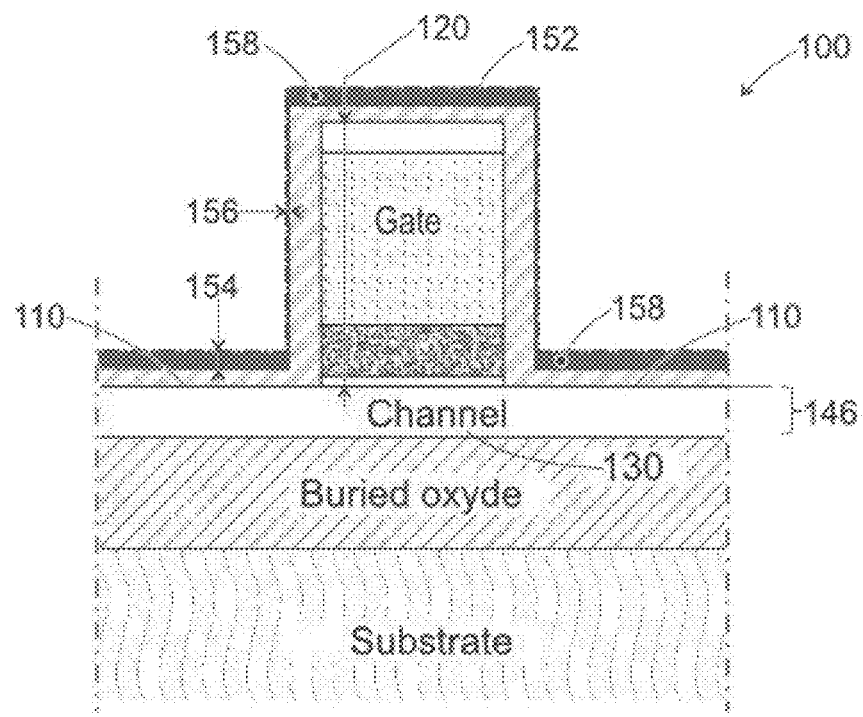

FIG. 3b illustrates the following step of the invention applied to the realization of FDSOI transistors in which a modification 158 to the layer 152 of silicon nitride that has just been deposited is carried out directly. As will be seen subsequently, this operation can optionally have been preceded by a conventional dry etching of the $CH_3F/O_2/He$ type described previously.

The step of modifying the layer of nitride as deposited, or of the layer remaining after a first conventional etching, is performed by implantation of light species, also referred to as light ions. It will be recalled that "light ion" means ions coming from materials the atomic number of which in the periodic classification of elements is low and in general all the elements that can be implanted in a material to be etched, without causing dislocation of its atomic structure such that it would cause sputtering thereof.

Typically, the modification of the layer to be etched is based on the implantation of light species such as hydrogen (H) or helium (He).

Advantageously, the implantation parameters, in particular the energy communicated to the ions, the duration and the implantation dose are provided so that the modified layer of nitride can be etched selectively with respect to the layer made from a semiconductor material.

Advantageously, these parameters are also adjusted so that the modified layer of nitride can be etched selectively with respect to the non-modified portion of the layer of nitride.

Advantageously, these parameters are also adjusted so that the modified layer of nitride can be etched selectively with respect to a layer made from an oxide, typically an oxide of said semiconductor material, the latter forming for example a layer of gate oxide. Typically, the etching is selective for silicon nitride modified by implantation of H or He vis-à-vis silicon oxide.

The implantation takes place for example in a gaseous plasma of hydrogen ($H_2$) or helium (He). An example of implementation of this step is discussed in FIG. 5. It should be noted here that this step of modifying the layer to be etched can be carried out in numerous different ways by adapting all kinds of means currently employed by the microelectronics industry. In particular standard etchers are used in which it is possible to develop plasmas of low or high density and where it is possible to control the energy of the ions to enable the implantation of the above light species intended to modify the layer to be etched. It is also possible to use a type of plasma referred to as immersion plasma normally used for carrying out an implantation of species on the surface of a device in the course of manufacture. Finally, the implantation can also be done in a standard implanter wherein the ions are accelerated in an electrical field in order to obtain implantation thereof in a solid.

The modification operation is advantageously highly anisotropic for realizing spacers on the flanks of the gates because of the directionality of the ions of the plasma or of the implanter. It therefore preferentially affects the horizontal surfaces, that is to say all the surfaces parallel to the plane of the substrate. The modified thickness on the horizontal surfaces 154 is thus appreciably greater than on the vertical surfaces, that is to say on all the surfaces perpendicular to the plane of the elaborate substrate on which the gate is disposed. This plane is perpendicular to the cutting plane shown in FIGS. 3a to 3d. The elaborate substrate preferably forms a plate with two parallel faces. It is for example in the form of a disc, a square, a polygon, etc. The thin layer 146, the buried oxide layer and the solid substrate are disposed in parallel planes. Thus a surface will be termed horizontal if it is parallel to the plane of the layer or layers forming the substrate on which the gate is formed and a surface will be termed vertical if it is perpendicular to this same plane.

Typically, a thickness 154 of 10 nm on the horizontal surfaces may be modified during this operation. A thickness 156 ranging from 1 to 3 nm of nitride is however also modified on the vertical surfaces whatever the conditions of the plasma. These vertical surfaces with respect to the plane of the substrate are therefore parallel to the flanks of the gate. The modified thicknesses depend on the conditions of implementation, in particular the means employed (plasma or implanter) and also because it is wished to obtain the etching of the spacers in a single global step of modification and etching or because on the contrary these operations are repeated until complete etching is obtained.

Thus, according to the particular implementations of the method of the invention and the initial thickness of the layer of nitride 152, the step of modifying this layer may affect all this layer or, as shown in the example in FIG. 3b, only a part thereof. In this case, the modification step and the following step of removal of the modified layer described below can be repeated until the nitride is completely removed on all the horizontal surfaces.

Figure 3C:
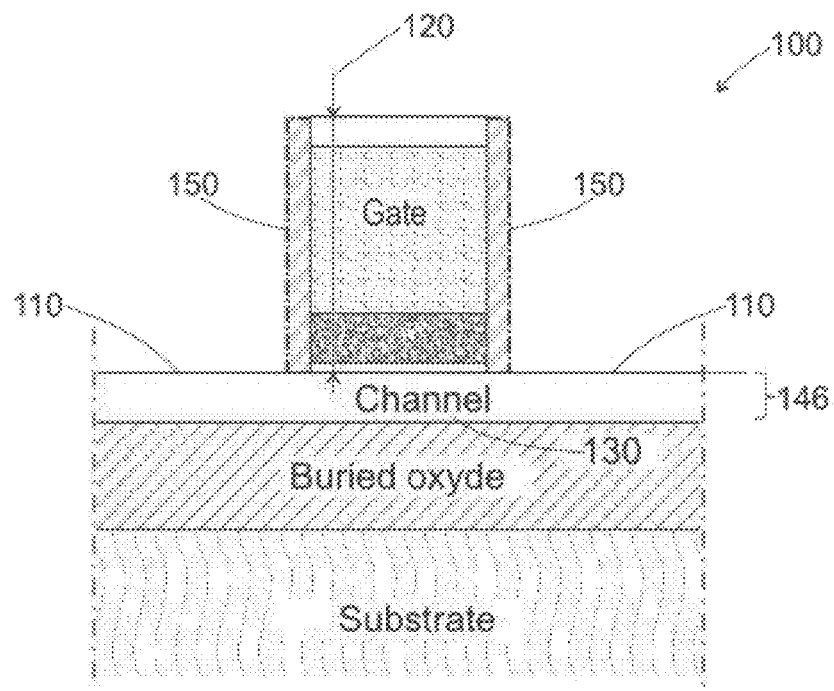

FIG. 3c illustrates the final result of the following step, after which the etching was carried out, that is to say the removal of the modified layer and possibly repeated, first the operation of modification described in the previous figure and secondly the operation of removal of the modified layer.

One method used for removing the modified layer 158 of silicon nitride consists, as already mentioned, of using an etching solution based on hydrofluoric acid (HF) or phosphoric acid ($H_3PO_4$). The etching is stopped on the non-modified layer of nitride or on the monocrystalline silicon of the layer 146 or on the hard mask 124 at the top of the gates. It should be noted here, with reference to the problem described in FIG. 1b, that there is no consumption of silicon due to the use of hydrofluoric acid or phosphoric acid. Moreover, optimisation of the step of modification by implantation of light species described above causes only a modification of the layer of nitride and the etching operation that follows therefore does not affect the underlying silicon. Thus, as shown, there is highly advantageously no consumption in the S/D regions 110 of the layer of silicon 146.

At the end of these operations, there therefore remains of the initial layer of silicon nitride only vertical patterns, essentially on the flanks of the stacking of layers that form the gate 120. They constitute the gate spacers 150 of the transistor.

Figure 3D:
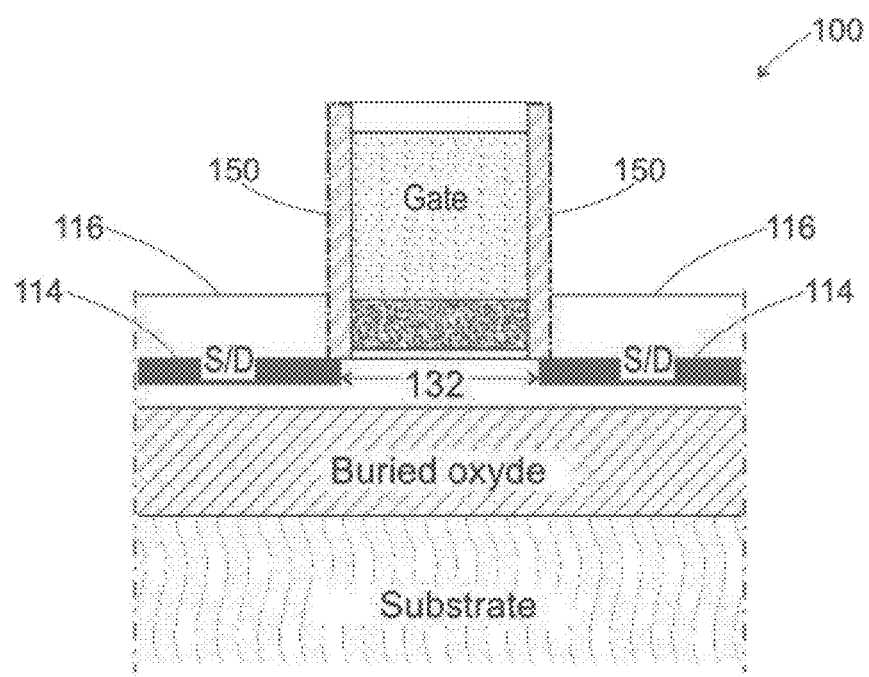

FIG. 3d illustrates the formation of drain and source regions of an FDSOI transistor.

At the end of the last or single step of removing the modified layer of nitride, that is to say when removal on all the horizontal surfaces has ended, a so-called "wet cleaning" operation is carried out. As already denoted previously, wet etching and wet clean are similar operations that can advantageously be combined in a single operation.

It is then possible to form the source and drain electrodes 110. As already mentioned, the doping that will delimit source and drain and therefore the length of the channel 132 can be done by ion implantation before proceeding with an epitaxial growth on these regions in order to increase their cross section and reduce their resistance. If the doping is carried out before epitaxial growth, as shown in FIG. 3d, the method is said to be "extension first", indicating that the extensions (of source and drain under the spacers) are realized first, that is to say before epitaxial growth. In the contrary case, which is said to be "extension last", the step of epitaxial growth without prior doping is proceeded with directly. The doping of the source/drain regions is carried out only after epitaxial growth of these regions. In the case of n-channel transistors (nMOS), the dopants implanted are typically arsenic (As) or phosphorus (P). For p-channel transistors (pMOS) the dopants are boron (B) or boron difluoride (BF2).

The result is illustrated in FIG. 3d, which shows the doped source/drain regions 114 before epitaxial growth of the raised source/drain regions 116.

Figure 4:
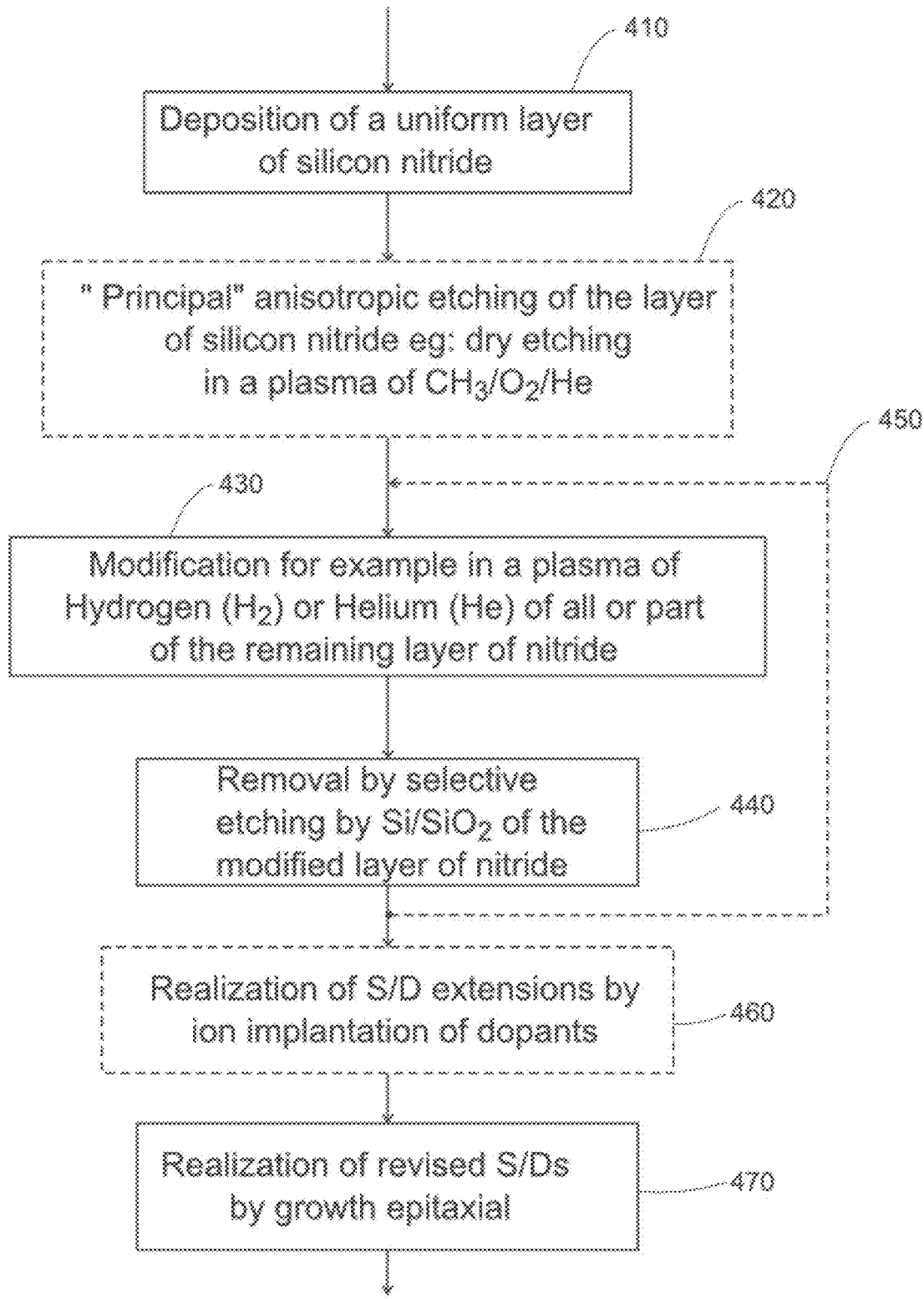
FIG. 4 summarises the steps of an example of a method of the invention intended to form spacers which do not cause or at the least limit the defects described in FIGS. 1b to 1d.

FIG. 4 summarizes the steps of the method of the invention intended to form spacers and which cause none of the defects described in particular in FIGS. 1b, 1c and 1d for realizing FDSOI transistors.

After deposition 410 by LPCVD of a uniform layer of silicon nitride on all the surfaces of the devices being manufactured, the layer of nitride on the surfaces that are not intended to form the spacers is removed. This removal comprises several steps, including steps 430, 440 and optionally the prior step 420.

Thus, optionally, a conventional anisotropic dry etching 420 of the nitride layer is carried out. This is typically performed in a plasma of the $CH_3F/O_2$/He type described previously. The etching of the spacers is thus, according to this optional and non-limitative embodiment, carried out in two steps comprising: a first so-called "principal etching" step and a second finishing step generally referred to as "overetching" (OE). It is during the overetching step (steps 440) that the nitride remaining on the horizontal surfaces will finally be removed, after having modified (step 430) the layer of nitride in order to avoid or limit the problems described in FIGS. 1b to 1d.

In the context of specific implementations of the invention, it may be decided to keep the principal etching step 420 or not, the following steps then being applied either to the layer of nitride as deposited or to the remaining layer of nitride after a principal etching has previously been carried out as in the standard method of etching the spacers.

As shown in FIG. 3b, the following step 430 consists of anisotropically modifying all or part 154 of the remaining layer of nitride 152 by implantation of hydrogen ($H_2$) or helium (He). As mentioned previously, this implantation of hydrogen or helium can be carried out in a standard implanter or in a plasma etching reactor, for example of the type used for the principal etching mentioned above. Depending on the applications of the method of the invention, it may be preferred to use a plasma etcher in particular for the following reasons:
  the cost of the equipment is lower;
  the manufacturing cycle times may be shorter since the principal etching step 420 and the step of modifying the layer of nitride 430 can then be done in the same equipment without returning the devices to the open air during manufacture;
  in addition, the implanters currently used are designed for dopants such as those mentioned previously: As, P and $BF_2$, which require high implantation energies. The use of these implanters for light species such as hydrogen or helium would require working in energy ranges of a few hundreds of electron volts (eV) only, which are very far from the normal conditions of use of this equipment.

However, despite the higher cost of the implanters and the drawbacks mentioned above, these may be useful and preferred, or even necessary, for certain applications such as for realizing three-dimensional transistors of the so-called Fin-FET type shown in FIGS. 2a to 2i. An example of the need to have recourse to such a means is illustrated below in FIGS. 7a to 7g, where several implantations are carried out in different directions of implantation.

The following step 440 is the one where removal by etching of the modified layer or at least of the modified thickness of the layer of nitride is carried out. To avoid the problems of the traditional methods of etching the spacers described in FIGS. 1b to 1d, it is necessary for the etching of the modified layer to be as selective as possible with respect to the silicon, in particular in order not to attack the monocrystalline silicon of the source-drain regions with the drawbacks and consequences described in FIG. 2a.

To do this, a wet etching based on hydrofluoric acid (HF) or phosphoric acid ($H_3PO_4$) which, as already mentioned, combines the removal of the modified layer with a cleaning of the slice containing the devices in the course of manufacture, is advantageously used. This simplifies the method and affords a saving in time.

The thickness of the modified layer is typically in a range of values ranging from 1 nm to a few tens of nm. The etching times may range from a few seconds to a few minutes. They are obviously directly dependent on the thickness that has been modified. By way of example, in order to remove a thickness of 10 nm of modified nitride around 30 seconds is needed with a 1% solution of hydrofluoric acid. The same etching time is obtained with 85% dilute phosphoric acid.

The etching of the modified layer will also be as selective with respect to the silicon dioxide in applications of the method other than the one serving for realizing spacers of transistors or of the FDSOI type where this is not useful. This is in particular the case for being able to realize three-dimensional transistors of the FinFET type. A selective dry etching for silicon and its oxide ($Si/SiO_2$) can then also be carried out for this step of removing the modified nitride layer. This type of dry etching is described in FIG. 6.

As already mentioned, the operations of modifying 430 the layer of nitride and removing 440 the modified layer can optionally be repeated 450 until nitride disappears on all the horizontal surfaces.

The following steps of the method are not different from the corresponding ones of the standard methods where possibly the extensions of the source/drain regions 460 are realized by ion implantation of dopants before epitaxial growth of the raised source/drain regions 470 of FDSOI transistors.

The following table gives typical conditions of implementation of the step 430 of modifying the layer of nitride in the case of use of a standard plasma etching reactor. These conditions are greatly dependent on the thickness to be modified in the layer of nitride. This is only one particular example of implementation of step 430 of modifying the layer to be etched. As already mentioned previously, other means can be used for implanting light species, H or He, serving to modify the layer to be etched. In particular low- or high-density plasmas, immersion plasmas or standard implanters can be used.

| | |
|---|---|
| Etching reactor: | Any type of dry etching device is potentially usable and in particular the so-called ICP, inductively coupled plasma, type. The values below apply particularly to this type of etcher. |
| Modified thickness: | from 1 nm to a few tens of nm |
| Chemistry: | based on hydrogen ($H_2$) or helium (He) chemistry |
| Power of the source: | 0-2000 W |
| Bias power: | 20-2000 W |
| Pressure: | 5-100 millitorrs |
| Temperature: | 10-100° C. |
| Time | a few seconds to a few hundreds of seconds |

For example, in order to modify a thickness of 10 nm of silicon nitride, the conditions with hydrogen (H2) are: hydrogen flow 200 sccm (cubic centimeters per minute); power of the source=500 W; bias power=250 W; pressure=20 millitorrs; temperature=40° C.; time=60 s. If helium (He) is used, the biasing power is then 450 W.

As already discussed, the implantation can alternatively also take place in a conventional implanter with energies ranging from a few electron volts (eV) to a few hundreds of eV.

FIGS. 5a to 5e give, for the standard material used for forming the spacers, that is to say silicon nitride (SiN), the thicknesses of modified layers obtained according to various conditions of implementation of the step of implanting light species in a standard plasma etching reactor.

Figure 5A:
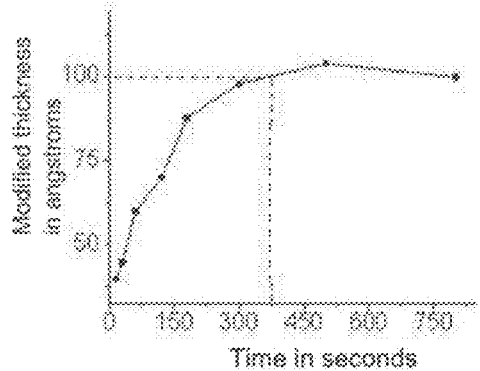
FIGS. 5a to 5e illustrate examples of typical conditions of implementation of the step of modifying the layer of nitride during the formation of the spacers.
Figure 5B:
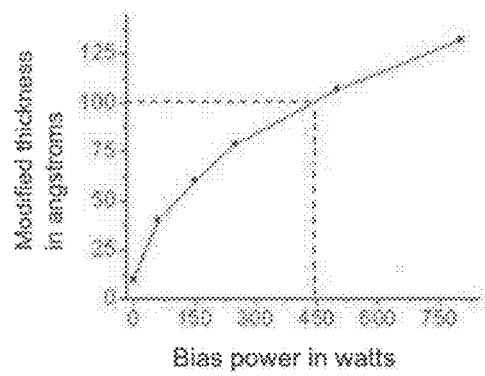

FIGS. 5a and 5b give the modified thickness as a function respectively of the time in seconds and the power of the bias in watts for an etching of the ICP type and under the following conditions, for FIG. 5a:

$H_2$ rate of 200 sccm; power of the source 500 watts; bias power 150 watts; pressure 10 millitorrs; temperature 50° C.; and for FIG. 14b:

$H_2$ rate of 200 sccm; power of the source 500 watts; time 60 seconds; pressure 10 millitorrs; temperature 50° C.

Figure 5C:
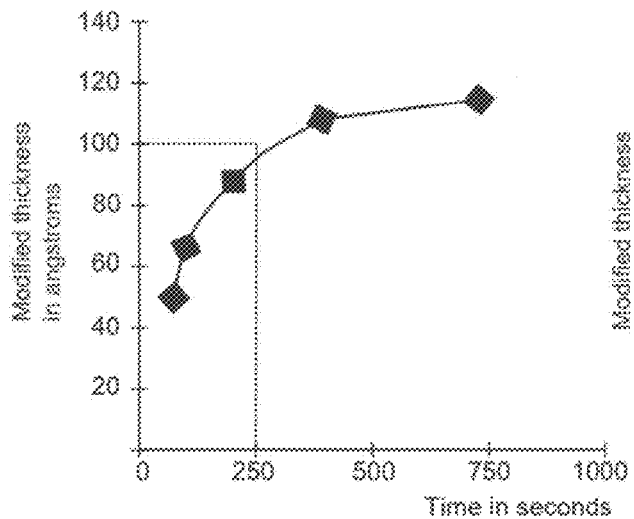
Figure 5D:
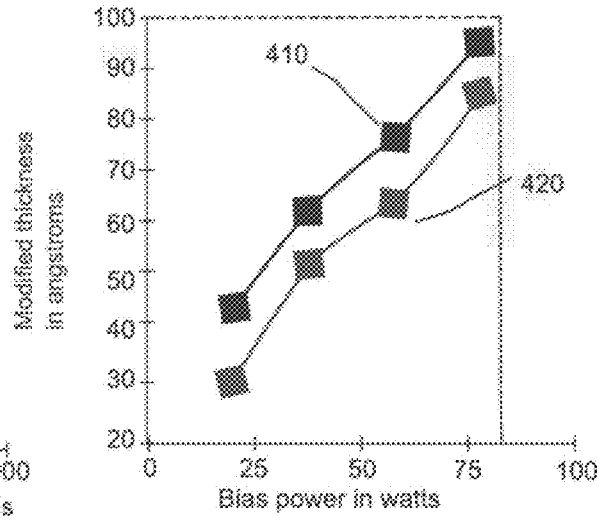

FIGS. 5c and 5d give the modified thickness as a function respectively of the time in seconds and the bias power in watts for an etcher of the so-called CCP type (capacitive coupled plasma) and under the following conditions, for FIG. 5c:

$H_2$ rate of 200 sccm; power of the source zero (0 watts); bias power 40 watts; pressure 10 millitorrs; temperature 50° C.; and for FIG. 5d:

$H_2$ rate of 200 sccm; power of the source zero (0 watts); time 60 seconds; pressure 10 millitorrs; temperature 50° C. In this figure the curve 410 corresponds to hydrogen implantation, the curve 420 corresponds to helium implantation.

Figure 5E:
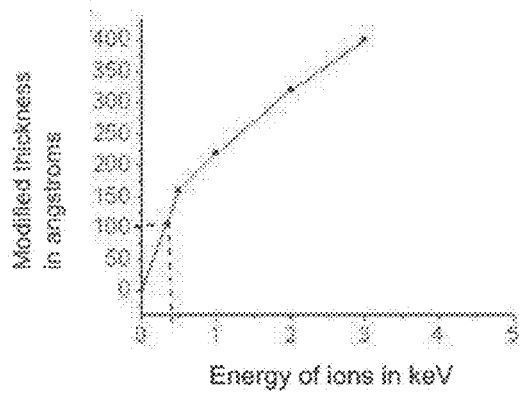

FIG. 5e corresponds to the case of an immersion plasma. The implanted thickness is given as a function of the energy communicated to the $H_2$ ions in keV and for an ion flow of 0.1 milliamperes per square centimeter ($mA/cm^2$).

Figure 6:
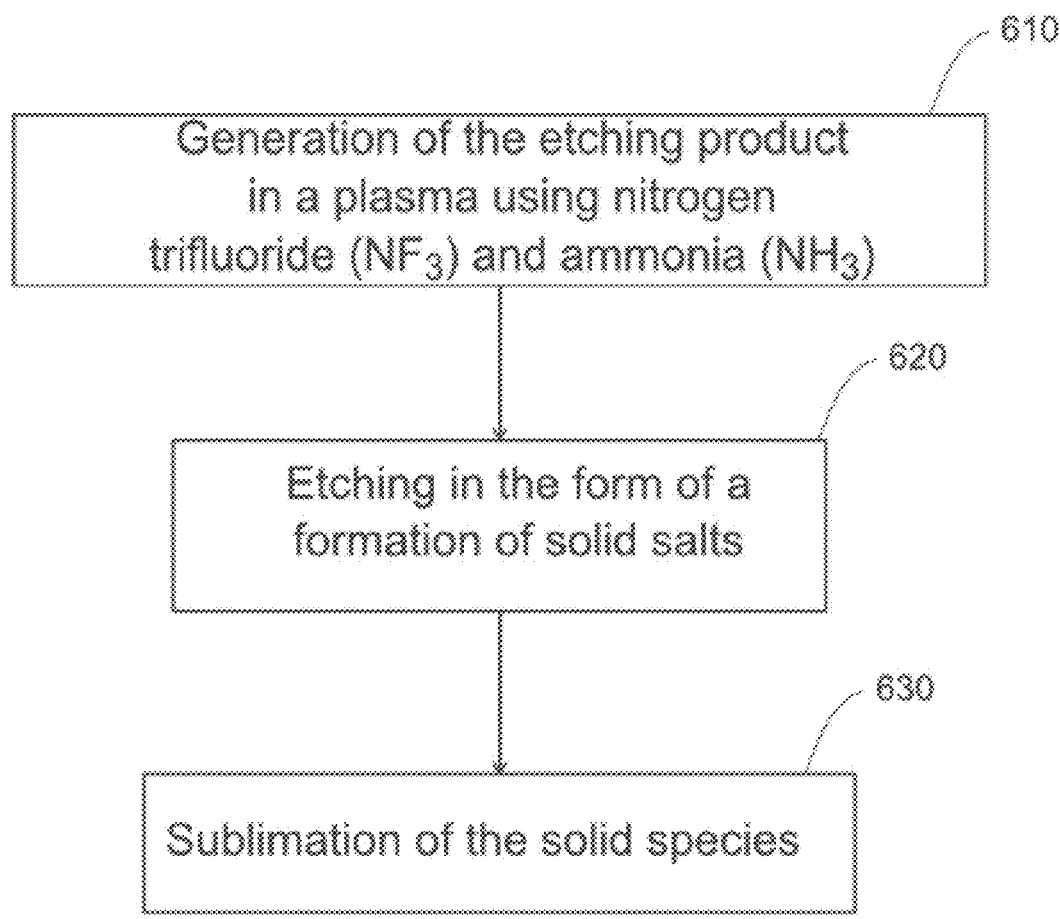
FIG. 6 shows the steps of the dry removal of the layer of silicon nitride that has been modified by implantation, for example, of hydrogen.

FIG. 6 shows the steps of the dry removal of the layer of silicon nitride that has been modified by implantation, for example hydrogen.

The method is that described by H. Nishini and his co-authors in a publication entitled "Damage-free selective etching of Si native oxides using $NH_3/NF_3$ and $SF_6/H_2O$ down flow etching" which appeared in the Journal of Applied Physics, volume 74 (2), in July 1993.

The principle of the dry removal of the layer of silicon nitride is identical to that described in the above publication. The difference is that, in the case of the invention, it is not silicon oxide that is etched but a layer of silicon nitride with hydrogen implants. The mechanism is however the same and comprises the following steps, which take place in a reaction chamber where a plasma is formed. The thicknesses treated are typically between 1 nm and a few tens of nanometers.

A first step 610 consists of generating the etching product in the plasma according to the following chemical reaction:

$$NF_3+NH_3 \rightarrow NH_4F+NH_4F.HF$$

which makes nitrogen trifluoride ($NF_3$) react with ammonia ($NH_3$).

The etching is done during a second step 620, at a temperature of around 30° C. and more generally between 10° C. and 50° C., in the form of a formation of salts in accordance with the following chemical reaction:

$$NH_4F \text{ or } NH_4F.HF+SiNH \rightarrow (NH_4)2SiF_6 \text{ (solid)}+H_2$$

during an operation that lasts for between a few seconds and a few minutes and takes place at a pressure between a few millitorrs and a few torrs. More precisely, this process takes between 20 seconds and 20 minutes and is performed under a pressure of 500 milli Torr and 3 Torr.

The solid species that are formed during this operation are then sublimated 630 at a temperature above 100° C. for a few tens of seconds in accordance with the following reaction:

$$(NH_4)2SiF_6 \text{ (solid)} \rightarrow SiF_4(g)+NH_3(g)+HF(g)$$

For example, in order to remove a layer of 10 nm of modified nitride, the flows of nitrogen trifluoride ($NF_3$) and ammonia ($NH_3$) are respectively 50 sccm and 300 sccm at 30° C. for 45 seconds for the step 620 of formation of salts, which is followed by the step of sublimation 630 that takes place at 180° C. for 60 seconds.

This embodiment allows obtaining an enhanced selectivity of the etching of the nitride modified vis a vis the non-modified nitride and the semiconductor material. Typically, the selectivity of this etching is greater (typically at least a factor of 10) than that obtained with HF.

It is remarked here that there exist etching reactors making it possible to carry out implantation, for example of hydrogen, using a plasma that can be followed, in the same system, by the removal of the modified layer by means of a dry etching as described above. Thus it is possible in this case to link the cycles of modifying and removing the nitride selectively with Si or $SiO_2$ without returning the slice to the open air. This is an additional encouragement for the use of an etching reactor for implementing the method rather than using a standard implanter whenever possible.

In this type of etching reactor it is also possible to proceed with the removal of the modified layer by means of a standard plasma etching. The following table, which concerns silicon nitride (SiN), corresponds to a removal of the layer to be etched after this material has previously been modified in an etching chamber of the ICP type under the following conditions: $H_2$ rate 200 sccm; temperature of the substrate 20° C.; power of the source controlling the dissociation of the species 500 watts; power of the biasing controlling the energy communicated to the ions 150 watts; pressure 20 millitorrs; duration 60 seconds. This operation is followed by a standard $CH_3F/O_2/He$ plasma etching. It is found that the rate of etching of the modified silicon is increased by 40%.

|  |  | Etching speed in nm per minute |
|---|---|---|
| Non-modified layer + standard etching | SiN + $CH_3F/O_2/He$ (ICP) | 33 |
| Modified layer | SiN + $H_2$ 350 Wb/ 2 min (ICP) | 0 |
| Modified layer + standard etching | SiN + H2 350 Wb/2 min (ICP) + $CH_3F/O_2/He$ (ICP) | 46 |

In summary, the invention enables in particular anisotropic etching of a substantially uniform layer of nitride selectively vis-à-vis the silicon and silicon dioxide. The method is based on two principal steps comprising:
  a step 430 of implantation of hydrogen ($H_2$) or helium (He) in order to modify all or part of the layer of nitride;
  a step 440 of removing the layer of modified nitride selectively for silicon and/or its oxide.

This approach proves to be particularly advantageous for forming the spacers of MOSFET transistors.

This approach dispenses in particular with the problems of the consumption of silicon and formation of nitride feet at the interface with the SOI substrate described in FIGS. 1b and 1c as well as limiting the erosion of the nitride spacers.

For certain applications it is necessary to have very precise control of the "faceting", that is to say the problem disclosed in FIG. 1d, which results from the conventional etching operations and may therefore be caused by the principal etching step 420, which is, as seen, optional. Advantageously, to overcome this problem, this step will be avoided and will be replaced by a repetition 450 of the operations 430 of modifying the layer of nitride and removing 440 the modified layer as described in FIG. 4, the removal preferably taking place in this case in the form of a dry removal as described in FIG. 6 since, as remarked above, the two operations can be performed in the same etching reactor.

Moreover, the invention, by enabling anisotropic etching of a substantially uniform layer of nitrides selectively vis-à-vis the silicon and silicon dioxide, also finds an application in realizing three-dimensional transistors of the FinFET type.

For the latter application (FinFET), and for others, it should be noted that the method of the invention can also advantageously be employed, in combination with the use of standard implanters, for effecting an isotropic etching or an etching in different favoured directions as illustrated in the example in FIGS. 7a to 7h.

These figures describe an option for modifying the layer to be etched that is applied when an implanter is used for implanting the light species during the step 430 of the method of the invention and obtaining an etching of several faces that are not parallel to each other despite the fact that the beam of ions is very directional.

Figure 7A:
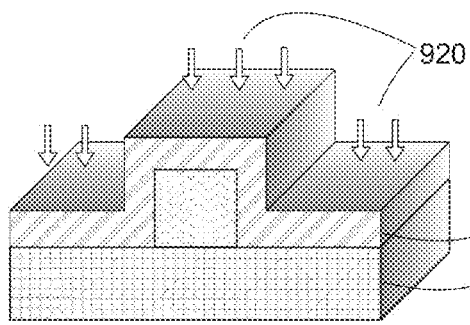
FIGS. 7a to 7h illustrate how the method of the invention can also be employed, in combination with the use of standard implanters, for effecting an isotropic etching or a succession of anisotropic etchings the favoured directions of which are different.
Figure 7B:
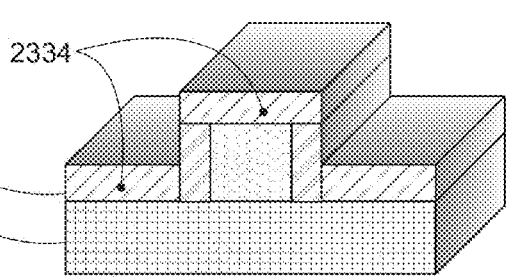

FIGS. 7a and 7b describe the result of a first step of implantation using the very directional beam of ions 920 generated by a standard implanter. As shown in FIG. 7a, the bombardment of the ions 920 is done essentially vertically in this figure, that is to say perpendicular to the plane of the layers of the device being manufactured. Only the surfaces 2334 perpendicular to the favoured direction of the beam (that is to say the horizontal surfaces as illustrated in FIGS. 7a and 7b) are then modified as shown in FIG. 7b.

Figure 7C:
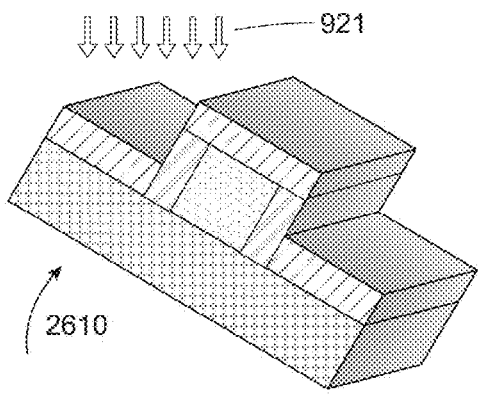
Figure 7D:
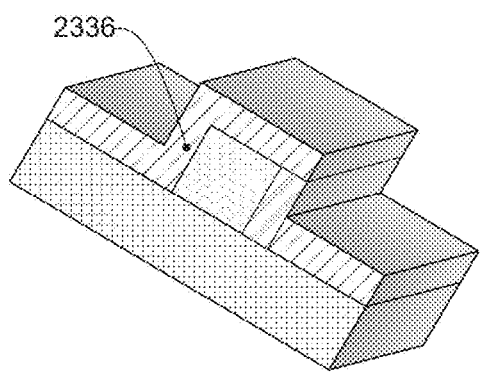
Figure 7E:
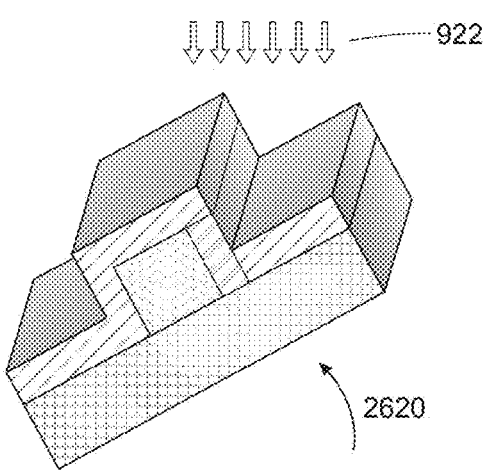
Figure 7F:
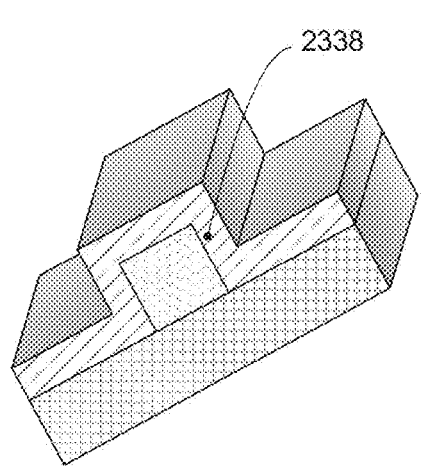
Figure 7G:
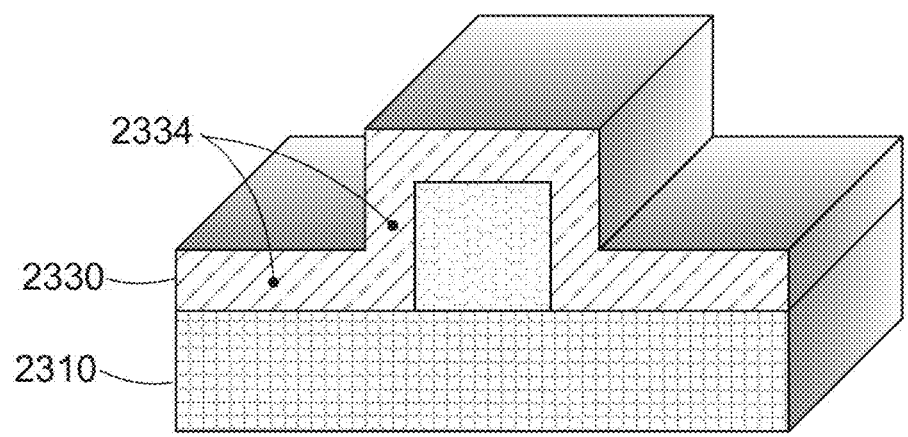

In order, in an implanter, to be able to modify the flanks of the patterns, a second implantation 921 is next carried out, as shown in FIG. 7c, after having inclined 2610 the target in the implantation chamber, that is to say the substrate being manufactured. This in order to be able to expose a flank of the patterns to be etched. Advantage is taken here of the fact that, in the case of an implanter, it is possible to orient the target as well as possible, both in rotation and inclination, in order to expose all the regions to be etched by the ion beam. The result is as shown in FIG. 7d. The material to be etched is modified in the regions exposed 2336 to the direction of bombardment of the implanter. As shown in FIGS. 7e and 7f, the operation of implantation 922 is repeated after having inclined the substrate 2620 in order to expose the other flank of the patterns and to modify 2338 the material in the regions exposed. The above operations may have to be repeated, with different orientations, as many times as necessary, in order to expose all the surfaces to be etched. The final result is as shown in FIG. 7g. It is then possible to proceed with the complete removal of the layer to be etched. There then no longer remains any layer 2330 on the pattern or on the layer 2310. Such is the case if the pattern is a fin of a FinFET transistor. The layer of nitride is removed on the flanks and top of the pattern as well as on the layer 2310 underlying the pattern.

Figure 7H:
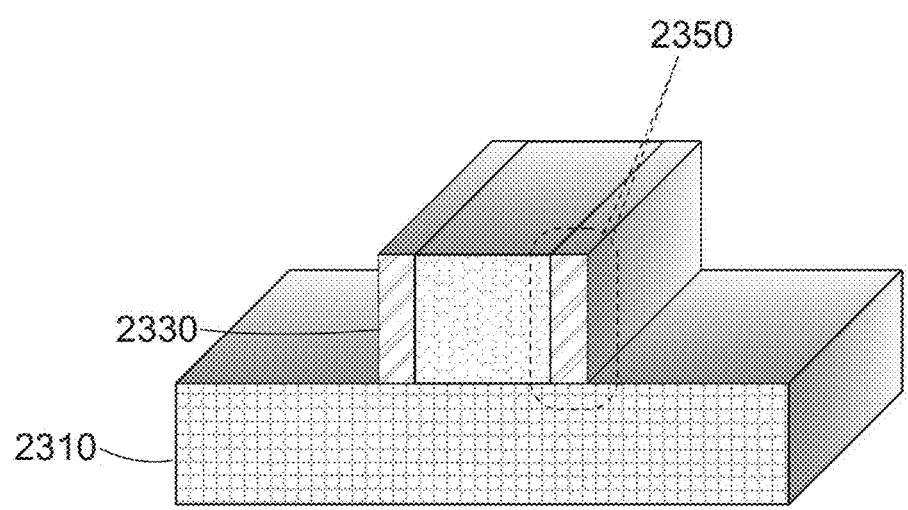

Optionally, and as mentioned previously, it is possible to choose to control precisely the thickness of the non-modified layer 2330 that remains on the flanks. For this purpose, the implantations carried out when the substrate is inclined so as to implant the flanks are adjusted, for dose and energy in particular, so that only a portion of the thickness of the layer 2330 present on the flanks is modified. Thus, on the flanks, only part of the thickness of this layer 2330 is etched during the removal step whereas, outside the flanks, the entire thickness of this layer 2330 is etched during the step. The result obtained is therefore as shown in FIG. 7h, a control thickness being taken from the flanks.

The invention is not limited solely to the embodiments and examples described above, but extends to all embodiments falling within the scope of the claims.

The invention claimed is:

1. A method for forming spacers for a gate of a field effect transistor, the gate being situated above a layer of semiconductor material, comprising:
    forming a layer of nitride covering the gate;
    modifying the layer of nitride by plasma implantation of light ions, having an atomic number equal or less than 10, in the layer of nitride in order to form a modified layer of nitride, the modifying being performed so as not to modify the layer of nitride over its entire thickness at flanks of the gate; and
    removing the modified layer of nitride by a selective wet etching, or a selective dry etching, of the modified layer of nitride relative to said layer of semiconductor material and relative to the non-modified layer of nitride at the flanks of the gate, without etching the layer of semiconductor material,
    wherein an entire length of the non-modified layer of nitride at the flanks of the gate remains after the selective wet etching, or after the selective dry etching.

2. The method according to claim 1, wherein the implantation of light ions and the implanted dose are implemented so that the modified layer of nitride is configured to be etched selectively relative to said layer of semiconductor material and relative to the non-modified layer of nitride.

3. The method according to claim 1, wherein the layer of nitride is a layer of silicon nitride.

4. The method according to claim 1, wherein the modifying the layer of nitride by plasma implantation modifies the layer of nitride continuously from a surface of the nitride layer to a depth in the nitride layer between 1 nm and 30 nm.

5. The method according to claim 1, wherein the modifying the layer of nitride is preceded by anisotropic etching.

6. The method according to claim 5, wherein the anisotropic etching comprises a dry etching in a plasma based on methyl fluoride ($CH_3F$).

7. The method according to claim 1, wherein the modifying comprises putting the layer of nitride in a presence of the plasma comprising the light ions in an etching reactor.

8. The method according to claim 1, wherein the modifying includes implantation of light ions by an implanter.

9. The method according to claim 1,
    wherein the layer of semiconductor material is at least one of silicon (Si), germanium (Ge), and silicon-germanium (SiGe), and
    wherein the selective wet etching, or the selective dry etching, is selective to the layer of semiconductor material and/or an oxide of the semiconductor material.

10. The method according to claim 9, wherein the wet etching is selective to silicon by a solution based on hydrofluoric acid (HF).

11. The method according to claim 9, wherein the wet etching is selective to silicon and includes applying a solution based on phosphoric acid ($H_3PO_4$).

12. The method according to claim 1, wherein the layer of semiconductor material includes silicon (Si), and wherein the dry etching is selective to the silicon (Si) and/or to silicon oxide ($SiO_2$).

13. The method according to claim 12, wherein the dry etching is performed in a plasma formed in a confined chamber using nitrogen trifluoride ($NF_3$) and ammonia ($NH_3$).

14. The method according to claim 1, wherein the dry etching comprises:
    dry etching consisting of formation of solid salts; and
    sublimating the solid salts.

15. The method according to claim 1, wherein the modifying the layer of nitride and the removing the modified layer of nitride are performed within a single plasma reactor.

16. The method according to claim 1, the modifying being a single step modification performed so as to modify the layer of nitride throughout its thickness over all surfaces parallel to a plane of a substrate on which the gate rests and so as not to modify the layer of nitride throughout its thickness on surfaces perpendicular to the plane.

17. The method according to claim 1,
    wherein the modifying and removing include multiple sequences each comprising a step of modification and a step of removal, and
    wherein, during at least one of the steps of modification, only part of the thickness of the layer of nitride is modified.

18. The method according to claim 17, wherein the multiple sequences are repeated until the layer of nitride disappears on all surfaces parallel to a plane of a substrate on which the gate rests.

19. The method according to claim 1, wherein the gate of the field effect transistor is situated on a stack of layers forming an elaborate substrate of silicon on insulator (SOI).

20. The method according to claim 1, wherein the layer of semiconductor material is at least one of silicon (Si), germanium (Ge), and silicon-germanium (SiGe).

21. The method according to claim 1, wherein the selective wet etching is selective to silicon oxide ($SiO_2$).

22. The method according to claim 1, wherein the light ions include at least one of helium (He) and hydrogen ($H_2$).

23. The method according to claim 1, wherein the field effect transistor is a FDSOI transistor.

24. The method according to claim 1, wherein the field effect transistor is a FinFET transistor.

25. The method according to claim 1,
wherein the plasma implantation of light ions comprises at least two plasma implantations having different implantation directions, and
wherein, to modify the direction of the plasma implantation, the layer of nitride is inclined.

26. A method of etching a layer of nitride selectively relative to silicon (Si) and/or silicon oxide ($SiO_2$), comprising:
at least one step of modifying all or part of the layer of nitride by plasma implantation of hydrogen ($H_2$) or helium (He) in the layer of nitride in order to form a modified layer of nitride, wherein the at least one step of modifying comprises putting the layer of nitride in a presence of a plasma comprising hydrogen ions or helium ions in an etching reactor; and
at least one step of removing the modified layer of nitride by selective wet etching, or selective dry etching, of the modified layer of nitride relative to the silicon (Si) and/or silicon oxide ($SiO_2$) from all surfaces parallel to a plane of a substrate on which a gate rests,
wherein the selective wet etching, or the selective dry etching, does not remove an entire length of the layer of nitride on surfaces perpendicular to the plane.

27. The method according to claim 26, wherein the selective wet etching includes applying a solution based on phosphoric acid ($H_3PO_4$).

28. The method according to claim 26, wherein the selective wet etching includes applying a solution based on hydrofluoric acid (HF).

* * * * *